US010896963B2

(12) United States Patent
Mehandru et al.

(10) Patent No.: US 10,896,963 B2
(45) Date of Patent: Jan. 19, 2021

(54) SEMICONDUCTOR DEVICE CONTACTS WITH INCREASED CONTACT AREA

(71) Applicant: INTEL CORPORATION, Santa Clara, CA (US)

(72) Inventors: Rishabh Mehandru, Portland, OR (US); Tahir Ghani, Portland, OR (US); Szuya S. Liao, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/754,887

(22) PCT Filed: Sep. 25, 2015

(86) PCT No.: PCT/US2015/052330
§ 371 (c)(1),
(2) Date: Feb. 23, 2018

(87) PCT Pub. No.: WO2017/052617
PCT Pub. Date: Mar. 30, 2017

(65) Prior Publication Data
US 2018/0248011 A1 Aug. 30, 2018

(51) Int. Cl.
*H01L 29/417* (2006.01)
*H01L 29/06* (2006.01)
(Continued)

(52) U.S. Cl.
CPC ........ *H01L 29/41766* (2013.01); *B82Y 10/00* (2013.01); *H01L 21/26513* (2013.01);
(Continued)

(58) Field of Classification Search
CPC ......... H01L 29/41766; H01L 29/41791; H01L 21/26513; H01L 2029/7858;
(Continued)

(56) References Cited

U.S. PATENT DOCUMENTS 5,164,330 A * 11/1992 Davis ................ H01L 21/32115
257/E21.303
7,102,951 B2 9/2006 Paillet et al.
(Continued)

FOREIGN PATENT DOCUMENTS

CN 102446765 5/2012
CN 102487014 6/2012
(Continued)

OTHER PUBLICATIONS

International Search Report and Written Opinion received for PCT No. PCT/US2015/052330. dated Jun. 15, 2016. 15 pages.
(Continued)

*Primary Examiner* — Wael M Fahmy
*Assistant Examiner* — Sarah K Salerno
(74) *Attorney, Agent, or Firm* — Schwabe, Williamson & Wyatt, P.C

(57) ABSTRACT

Semiconductor contact architectures are provided, wherein contact metal extends into the semiconductor layer to which contact is being made, thereby increasing contact area. An offset spacer allows a relatively deep etch into the semiconductor material to be achieved. Thus, rather than just a flat horizontal surface of the semiconductor being exposed for contact area, relatively long vertical trench sidewalls and a bottom wall are exposed and available for contact area. The trench can then be filled with the desired contact metal. Doping of the semiconductor layer into which the contact is being formed can be carried out in a manner that facilitates an efficient contact trench etch process, such as by, for example, utilization of post trench etch doping or a semiconductor layer having an upper undoped region through which the contact trench etch passes and a lower doped S/D region. The offset spacer may be removed from final structure.

19 Claims, 8 Drawing Sheets

(51) Int. Cl.
    *B82Y 10/00*     (2011.01)
    *H01L 29/775*     (2006.01)
    *H01L 29/78*     (2006.01)
    *H01L 29/66*     (2006.01)
    *H01L 21/768*     (2006.01)
    *H01L 23/485*     (2006.01)
    *H01L 21/265*     (2006.01)
    *H01L 21/306*     (2006.01)
    *H01L 21/324*     (2006.01)
    *H01L 29/08*     (2006.01)
    *H01L 29/423*     (2006.01)
    *H01L 29/786*     (2006.01)

(52) U.S. Cl.
    CPC ...... *H01L 21/30604* (2013.01); *H01L 21/324* (2013.01); *H01L 21/76805* (2013.01); *H01L 21/76895* (2013.01); *H01L 21/76897* (2013.01); *H01L 23/485* (2013.01); *H01L 29/0673* (2013.01); *H01L 29/0847* (2013.01); *H01L 29/41725* (2013.01); *H01L 29/41733* (2013.01); *H01L 29/41791* (2013.01); *H01L 29/42392* (2013.01); *H01L 29/66439* (2013.01); *H01L 29/66742* (2013.01); *H01L 29/66772* (2013.01); *H01L 29/66795* (2013.01); *H01L 29/775* (2013.01); *H01L 29/785* (2013.01); *H01L 29/7851* (2013.01); *H01L 29/78618* (2013.01); *H01L 29/78696* (2013.01)

(58) Field of Classification Search
    CPC ......... H01L 21/76805; H01L 21/76897; H01L 21/41766; B82Y 10/00
    See application file for complete search history.

(56) References Cited

U.S. PATENT DOCUMENTS

| | | | |
|---|---|---|---|
| 2007/0018237 A1 | 1/2007 | Kim et al. | |
| 2007/0057325 A1 | 3/2007 | Hsu et al. | |
| 2007/0161170 A1* | 7/2007 | Orlowski | H01L 29/41791 438/197 |
| 2008/0124874 A1 | 5/2008 | Park | |
| 2008/0135935 A1* | 6/2008 | Cho | H01L 21/845 257/347 |
| 2008/0217775 A1* | 9/2008 | Pai | H01L 21/76877 257/751 |
| 2009/0273040 A1* | 11/2009 | Liang | H01L 29/665 257/402 |
| 2010/0052034 A1* | 3/2010 | Cheng | H01L 29/66825 257/316 |
| 2010/0112803 A1 | 5/2010 | Lee | |
| 2010/0163847 A1* | 7/2010 | Majhi | H01L 29/7848 257/24 |
| 2010/0193963 A1* | 8/2010 | Richter | H01L 21/7682 257/774 |
| 2011/0018053 A1* | 1/2011 | Lo | B82Y 10/00 257/325 |
| 2011/0291292 A1* | 12/2011 | Frohberg | H01L 21/76816 257/774 |
| 2012/0032275 A1* | 2/2012 | Haran | H01L 21/28518 257/401 |
| 2013/0207166 A1 | 8/2013 | Chen | |
| 2014/0117420 A1 | 5/2014 | Chen et al. | |
| 2014/0191298 A1 | 7/2014 | Chen | |
| 2014/0264482 A1 | 9/2014 | Li et al. | |
| 2014/0346575 A1* | 11/2014 | Chen | H01L 21/76897 257/288 |
| 2014/0346605 A1 | 11/2014 | Zeitzoff | |
| 2015/0054089 A1 | 2/2015 | Hong et al. | |
| 2015/0061015 A1 | 3/2015 | He | |
| 2015/0171084 A1 | 6/2015 | Lin | |
| 2016/0233164 A1* | 8/2016 | Choi | H01L 27/0924 |

FOREIGN PATENT DOCUMENTS

| | | |
|---|---|---|
| CN | 103137624 | 6/2013 |
| CN | 204271088 | 4/2015 |
| KR | 20090044582 | 5/2009 |
| TW | 201526238 | 7/2015 |
| TW | 201535714 | 9/2015 |
| WO | 2017/052617 A1 | 3/2017 |

OTHER PUBLICATIONS

International Preliminary Report on Patentability received for PCT No. PCT/US2015/052330. dated Apr. 5, 2018. 12 pages.

Search Report for European Patent Application No. 15904950.1, dated Apr. 1, 2019. 9 pgs.

Office Action for Taiwan Patent Application No. 105126786, dated Dec. 10, 2020, 16 pgs.

Office Action for European Patent Application No. 15904950.1, dated Jun. 25, 2020, 4 pgs.

Office Action for Chinese Patent Application No. 201580083356.9, dated Nov. 3, 2020, 14 pgs.

* cited by examiner

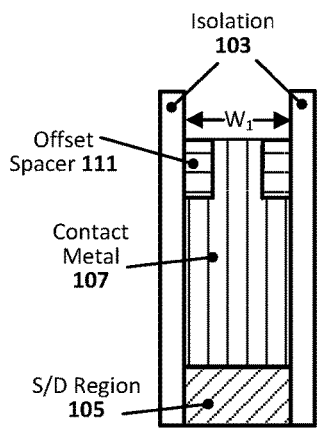
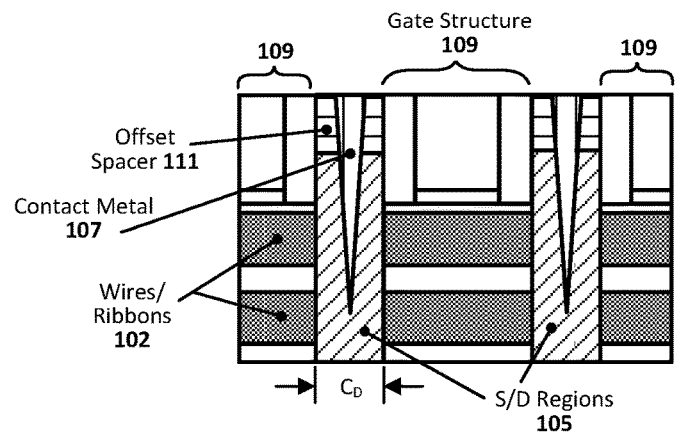
Fig. 6a
Fig. 6b
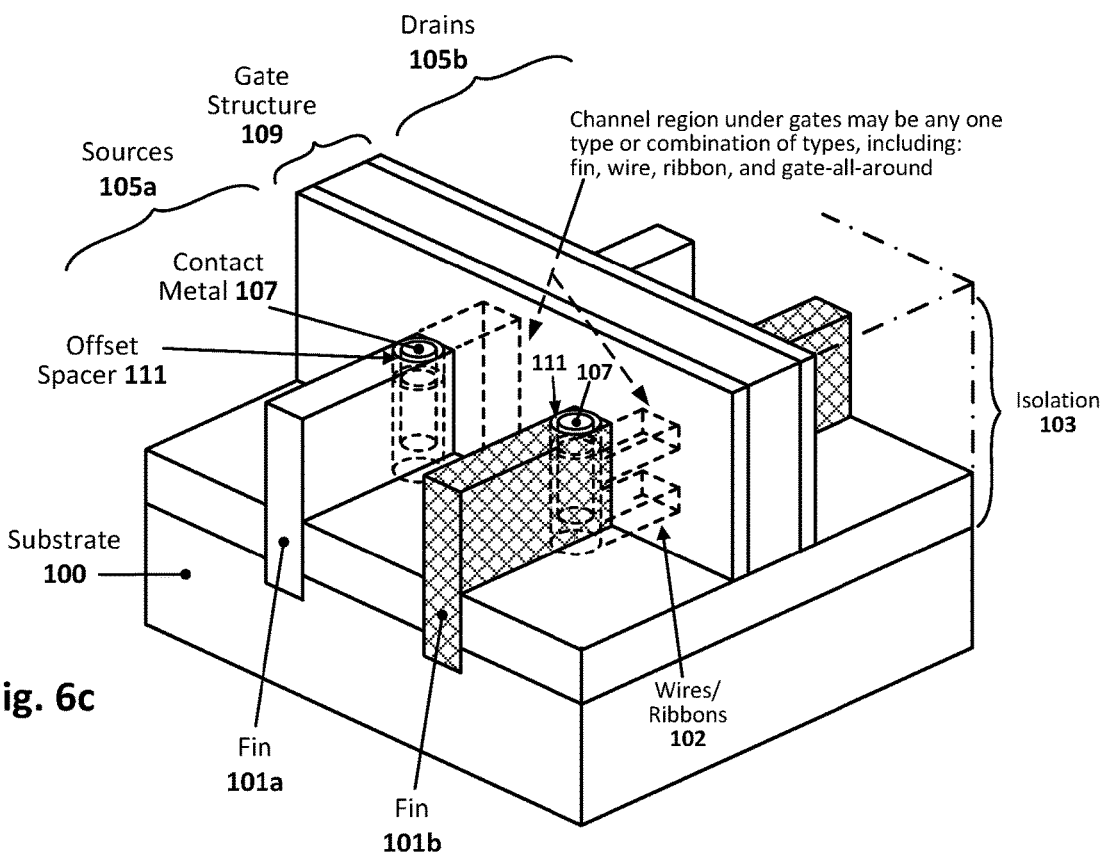
Fig. 6c
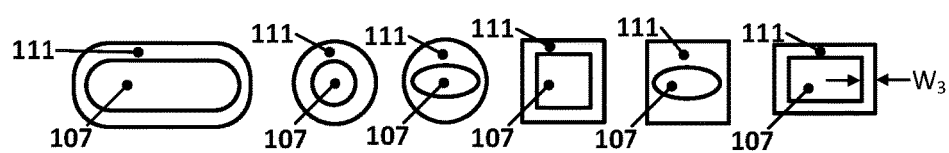
Fig. 6d

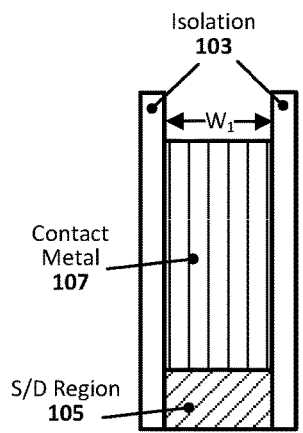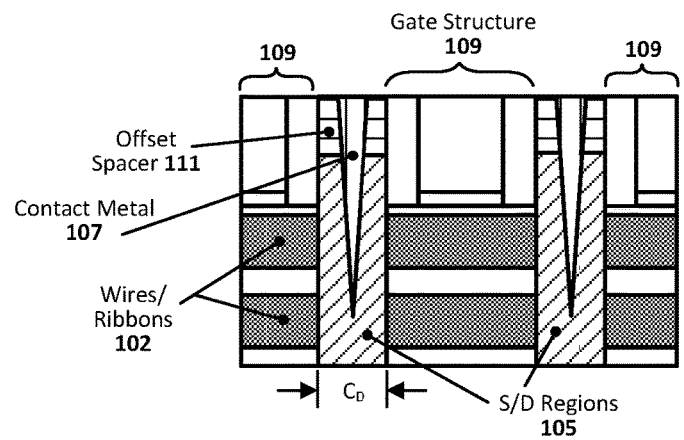
Fig. 7a
Fig. 7b
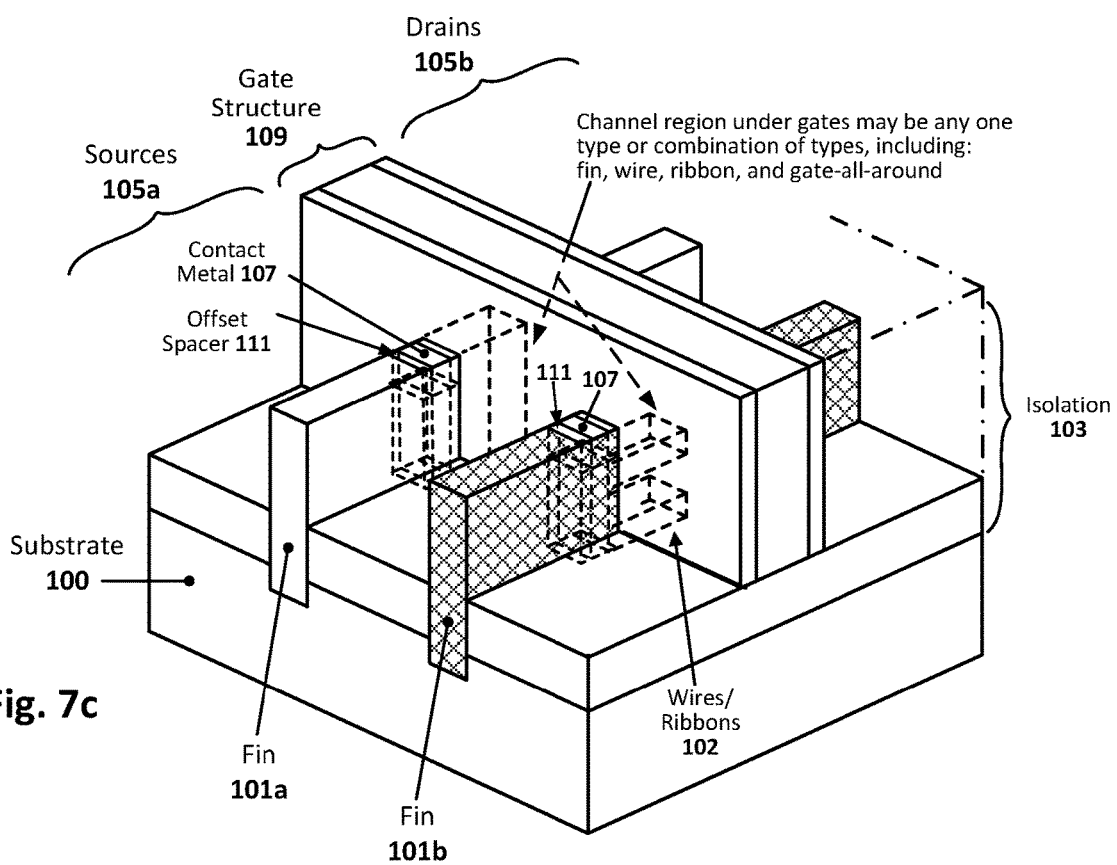
Fig. 7c
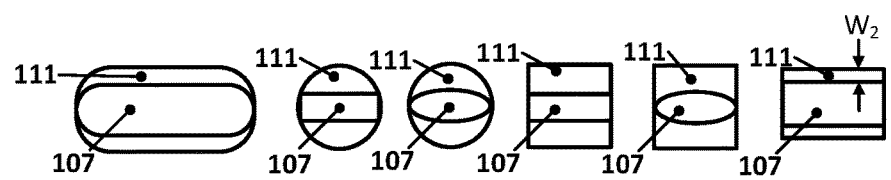
Fig. 7d

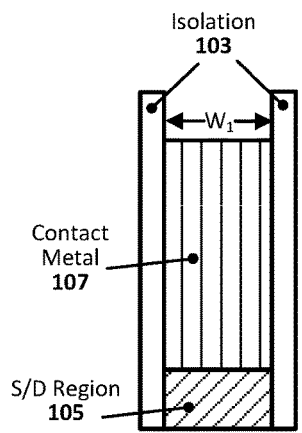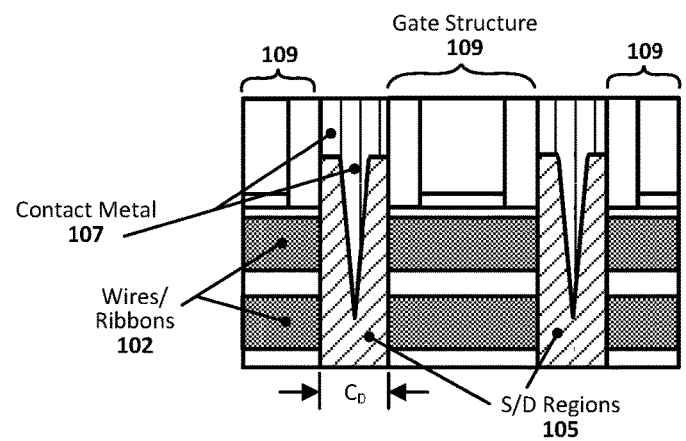
Fig. 8a
Fig. 8b
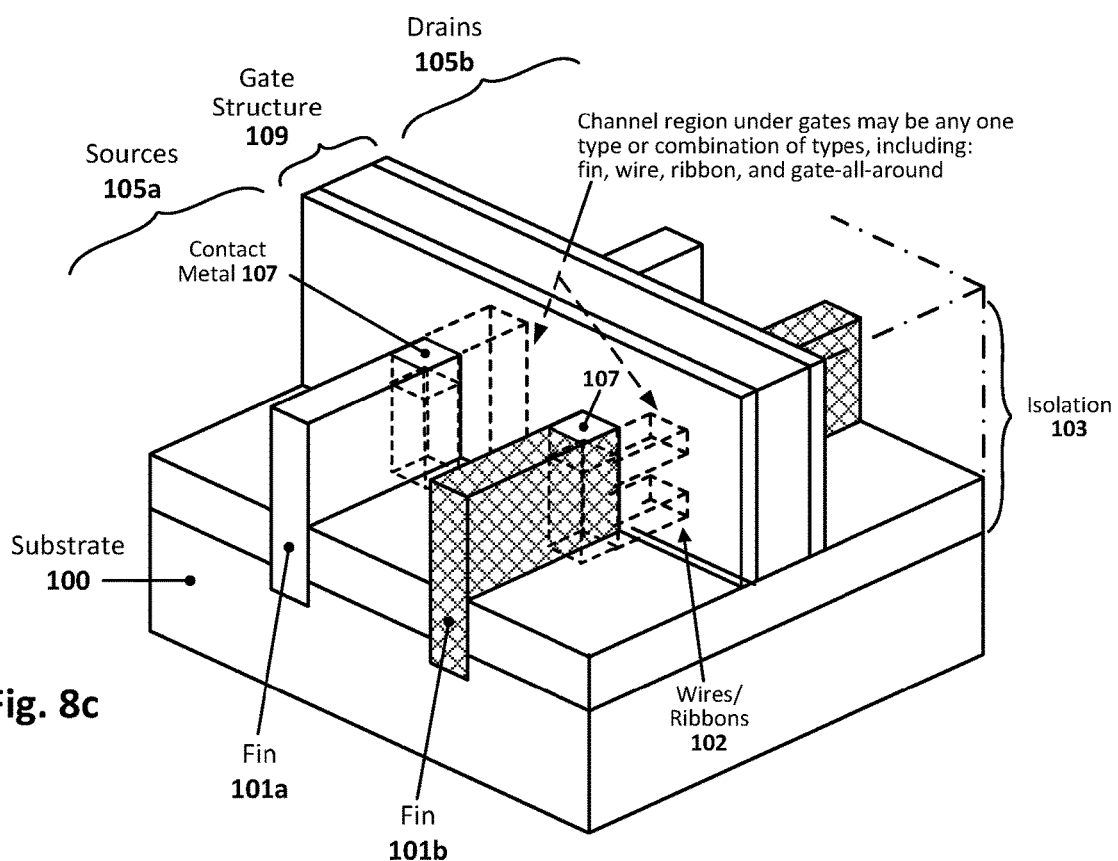
Fig. 8c
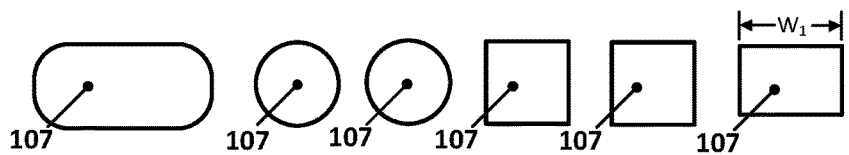
Fig. 8d

US 10,896,963 B2

SEMICONDUCTOR DEVICE CONTACTS WITH INCREASED CONTACT AREA

CROSS-REFERENCE TO RELATED APPLICATIONS

This patent application is a U.S. National Phase Application under 35 U.S.C. § 371 of International Application No. PCT/US2015/052330, filed on Sep. 25, 2015, the entire contents of which are hereby incorporated by reference herein.

BACKGROUND

Increased performance of circuit devices including transistors, diodes, resistors, capacitors, and other passive and active electronic devices formed on a semiconductor substrate is typically a major factor considered during design, manufacture, and operation of those devices. For example, during design and manufacture of metal oxide semiconductor (MOS) transistor semiconductor devices, such as those used in a complementary metal oxide semiconductor (CMOS) processes, it is often desired to minimize the parasitic resistance associated with contacts otherwise known as external resistance $R_{ext}$. Decreased $R_{ext}$ enables higher drive current from an equal transistor design.

BRIEF DESCRIPTION OF THE DRAWINGS

FIGS. 6a and 6b illustrate cross-sectional views of a non-planar semiconductor device having a contact architecture configured in accordance with another embodiment of the present disclosure.

FIG. 6c shows a perspective view of the example embodiment shown in FIGS. 6a and 6b.

FIG. 6d illustrates various top down views of example shapes that offset spacers and contact metals shown in FIGS. 6a through 6c may have, according to some such embodiments.

FIGS. 7a and 7b illustrate cross-sectional views of a non-planar semiconductor device having a contact architecture configured in accordance with another embodiment of the present disclosure.

FIG. 7c shows a perspective view of the example embodiment shown in FIGS. 7a and 7b.

FIG. 7d illustrates various top down views of example shapes that offset spacers and contact metals shown in FIGS. 7a through 7c may have, according to some such embodiments.

FIGS. 8a and 8b illustrate cross-sectional views of a non-planar semiconductor device having a contact architecture configured in accordance with another embodiment of the present disclosure.

FIG. 8c shows a perspective view of the example embodiment shown in FIGS. 8a and 8b.

FIG. 8d illustrates various top down views of example shapes that contact metals shown in FIGS. 8a through 8c may have, according to some such embodiments.

Figures 1A, 1B:
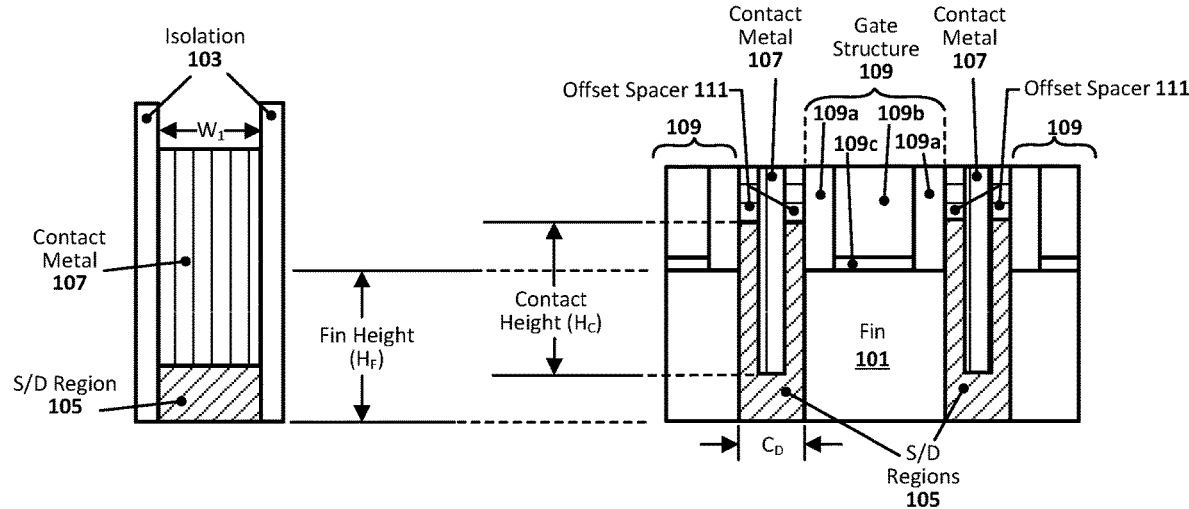
FIGS. 1a and 1b illustrate cross-sectional views of a non-planar semiconductor device having a contact architecture configured in accordance with an embodiment of the present disclosure.

As will be appreciated, the figures are not necessarily drawn to scale or intended to limit the disclosure to the specific configurations shown. For instance, while some figures generally indicate straight lines, right angles, and smooth surfaces, an actual implementation of a structure may have less than perfect straight lines, right angles, and some features may have surface topology or otherwise be non-smooth, given real world limitations of the processing equipment and techniques used. In short, the figures are provided merely to show example structures.

DETAILED DESCRIPTION

Semiconductor contact architectures are disclosed that have relatively large contact area and low resistance, relative to standard contacts. Standard contacts in MOS transistors typically utilize an exposed doped semiconductor region to make a contact, wherein the total contact area is horizontal and defined by the top-down exposed semiconductor area. In contrast, a contact architecture configured in accordance with an embodiment of the present disclosure provides an enhanced contact area, such that the contact extends into the semiconductor layer to which contact is being made. According to one example embodiment, an offset spacer is used during contact formation which has the effect of allowing a selective etch to be carried out. In particular, the underlying semiconductor layer etches at a faster rate than the offset spacer material, thereby allowing a relatively deep etch into the semiconductor material to be achieved without etching away other parts of the transistor structure. Thus, rather than just a single flat horizontal surface of the semiconductor being exposed for contact area, relatively long vertical trench sidewalls and a bottom wall are exposed and available for contact area. The trench can then be filled with the desired contact metal. Doping of the semiconductor layer into which the contact is being formed can be carried out in a manner that facilitates the contact trench etch process. For instance, in one example case, the semiconductor layer is doped after the contact trench is formed but before the contact metal is deposited into the trench, while in another example case the semiconductor layer is configured with an undoped portion through which the contact trench etch passes and a doped lower portion proximate to where the contact trench extends. In some embodiments, the contact architecture is formed on source/drain (S/D) regions, wherein the entire space between neighboring gate structures defines a critical horizontal distance ($C_D$), and the total contact area exceeds the $C_D$ by 4× or more. Note that in some embodiments, the offset spacer may exist in the final transistor structure, but in other embodiments may be removed during the trench etch process or after the trench etch is complete.

General Overview

As previously explained, increased drive current in the transistors can be achieved by reducing device resistance.

Contact resistance has become a very large fraction of a device's overall resistance. A typical transistor contact stack includes, for example, a silicon or silicon germanium (SiGe) source/drain layer, a nickel silicide layer, a titanium nitride adhesion layer, and a tungsten contact/pad. In any such configurations, the contact area is generally limited to the flat area of semiconductor material that is exposed during the contact trench etch process. As will be appreciated in light of this disclosure, there is a limited area on which a contact can be formed. For instance, the entire area between neighboring gate structures can be defined by a first distance from one gate spacer to the gate spacer of the neighboring transistor (which is referred to herein as $C_D$) multiplied by a second distance defining the width of the source/drain region (which is referred to herein as $W_1$). Thus, a regular contact that depends on top down source-drain opening has a contact area of about $C_D \times W_1$.

Thus, and in accordance with an embodiment of the present disclosure, contact forming techniques are provided that use an offset spacer to increase contact area, such that the contact extends into the semiconductor layer to which contact is being made. According to one example embodiment, the offset spacer effectively acts a collar or mask of material at the opening of the contact trench. The etch chemistry used to carry out the contact trench etch into the semiconductor layer can be selective to the offset spacer material and other non-target materials (insulator material surrounding the source/drain regions), or otherwise configured to etch the offset spacer material and any other non-target material at a slower rate than the targeted semiconductor material. Numerous selective etch schemes will be apparent in light of this disclosure. The offset spacer allows a relatively deep etch into the semiconductor material to be achieved without etching away other parts of the transistor structure. Thus, rather than just a single flat horizontal surface of the semiconductor being exposed for contact area, relatively long vertical trench sidewalls and a bottom wall are exposed and available for contact area. Once the semiconductor layer is doped, the trench can be filled with the desired contact metal. The offset spacer need not remain in the final structure.

Doping of the semiconductor layer into which the contact is being formed can be carried out in a manner that facilitates the contact trench etch process. For instance, in one example case, the semiconductor layer is doped after the contact trench is formed but before the contact metal is deposited into the trench, such as by an implant doping and anneal process. In another example case, the semiconductor layer is formed or otherwise configured with an undoped upper portion through which the contact trench etch will pass and a doped lower portion to which the contact trench extends. In still another embodiment, the semiconductor layer is configured with a graded dopant concentration, ranging from no or otherwise light doping at the top of the trench to a target doping level at the bottom of the trench. As will be appreciated in light of this disclosure, eliminating or otherwise reducing the doping in the semiconductor layer may make it easier to etch the contact trench (etching semiconductor material that has been doped may be more difficult than etching that same semiconductor material undoped). In still other embodiments, an etch scheme that is agnostic to any doping level may be used.

The depth of the contact trench etch can vary from one embodiment to the next, depending on the targeted contact area. The contact area is a function of trench depth and can be generally computed as according to Equation 1, in accordance with an example embodiment:

$$\text{Contact Area} = [(2 \times H_C) + (C_D - (2 \times W_2))] \times W_1 \quad \text{(Equation 1)}$$

where $H_C$ is the contact height, $C_D$ is the distance from the gate spacer of one gate stack to the gate spacer of the neighboring gate stack, $W_2$ is the offset spacer thickness (if present), and $W_1$ is the distance defining the width of the source/drain region. In some cases, the contact trench depth is in the range of 50% or more of the fin height, with an example fin height ($H_F$) being in the range of 30 to 50 nm, although any number of fin geometries can be used and the present disclosure is not intended to be limited to any particular one. In one specific embodiment, the contact trench is etched so as to undercut the gate structure, so as to allow for dopant implantation within the undercut. Such an undercut etch and doping implantation between the source/drain regions and the channel region may further help in reducing the overall resistance of a MOS device. For instance, a dopant may be implanted in the source/drain regions and a subsequent anneal may be carried out to diffuse the dopant towards the channel region.

Note that the source/drain region may be native fin material or a replacement source/drain material that is epitaxially deposited or otherwise provisioned. Further note that, depending on the process node and device density, each of $W_1$, $W_2$, and $C_D$ may vary from embodiment to the embodiment. As will be appreciated, the techniques provided herein can enhance contact area significantly, especially when device dimensions are scaled down and larger aspect ratio fins are employed. In one example case using 45 nm fins, assuming contact trench opening of 15 nm, contact area can be increased by as much as 4× by using an offset spacer technique, with the contact trenches being in the range of 20 to 30 nm deep, or deeper. The techniques may boost performance of devices by reducing contact resistance, allowing better performance per Watt. To this end, simulations show a performance gain of about 17% or better for a contact configured according to some embodiments, as compared to typical contact architectures.

The shape of the contact trench can vary from one embodiment to the next, and will depend on factors such as the mask pattern and etch chemistry used, the semiconductor material being etched, the offset spacer material, and whether or not an undercut etch is desired (where the source/drain regions extend at least partly under the gate spacer and possibly under the gate dielectric). The etch may be accomplished using any suitable etch technologies, including dry and/or wet etching, isotropic and/or anisotropic, or some combination thereof. Further note that there may be an undercut underneath the offset spacer and/or the gate. Any number of contact trench shapes may result (e.g., square, rectangular, elliptical, circular, angled, to name a few examples). Further note that the trench shape may further vary depending on the particular cross-sectional profile being viewed (e.g., a cross-sectional profile taken parallel to fin and through the fin may look different from a cross-sectional profile taken perpendicular to fin and through source/drain region). A contact structure formed in accordance with an embodiment of the present disclosure may be detected, for example, using transmission electron microscopy and scanning electron microscopy, or other suitable imaging technology, to show a metal contact extending into the semiconductor material to which contact is being made.

Methodology and Architecture

FIGS. 1a and 1b illustrate cross-sectional views of a non-planar semiconductor device having a contact architecture configured in accordance with an embodiment of the present disclosure. In particular, FIG. 1a shows a cross-sectional view taken perpendicular to the fin and cut through the source/drain region, while FIG. 1b shows a cross-sectional view taken parallel to the fin and cut through the fin and gate region. Note that not all typical device features are shown, so as to allow for focus on the contact architecture. The device may be, for example, an integrated circuit device having a plurality MOS transistors, such as FinFETs or nanowire configurations or other non-planar devices that generally employ a fin-like semiconductor body. A FinFET is a transistor built around a thin strip of semiconductor material (generally referred to as the fin). The transistor includes the standard field effect transistor (FET) nodes, including a gate over a channel, a source region, and a drain region. The conductive channel of the device resides on/within the outer sides of the fin beneath the gate. Specifically, current runs along and/or within both sidewalls of the fin (sides perpendicular to the substrate surface) as well as along and/or within the top of the fin (side parallel to the substrate surface). Because the conductive channel of such configurations essentially resides along/within the three different outer, planar regions of the fin, such a FinFET design is sometimes referred to as a tri-gate FinFET. Other types of FinFET configurations are also available, such as so-called double-gate FinFETs, in which the conductive channel principally resides only along/within the two sidewalls of the fin (and not along the top of the fin). A nanowire transistor (sometimes referred to as gate-all-around FET) is configured very similarly, but instead of a fin, a nanowire or nanoribbon (depending on the thickness of the wires) is used and the gate material generally surrounds the channel region on all sides. Depending on the particular design, nanowire transistors have, for instance, up to four effective gates. The contact techniques provided herein can be used with any such non-planar transistor configurations, although other configurations may benefit as well.

As can be seen in FIGS. 1a and 1b, the device includes a fin 101 upon which a number of gate structures 109 are formed, along with source/drain regions 105 to either side of each gate. The channel of the device is generally under the gate and between the source and drain regions, as typically done. Each gate structure 109 generally includes a gate spacer 109a, a gate electrode 109b, and a gate dielectric 109c. As will be appreciated, the gate structures 109 may be dummy gates (polysilicon electrode) that will be later replaced in a replacement metal gate (RMG) process, or an actual metal gate structure, depending on the desired process flow.

As can be further seen, an offset spacer 111 is provided at the contact trench opening, and metal contact 107 is formed in the contact trench of each of source/drain region 105. The contact extends a distance $H_C$ into the semiconductor material of source/drain region 105. In FIG. 1a note that that the source/drain regions 105 effectively occupy the entire space between neighboring isolation layers 103. This distance between isolation layers 103 is designated as $W_1$. In addition, and with reference to FIG. 1b, note that the source/drain regions 105 effectively occupy the entire space between neighboring gate structures 109, in this example embodiment. This distance between gate structures 109 is designated as $C_D$. Other embodiments may include additional insulator material between the S/D regions 105 and the gate structure 109. As will be appreciated in light of this disclosure, these dimensions $H_C$, $W_1$, $C_D$ can be used to estimate the contact area of a contact structure according to an embodiment. The fin height $H_F$ may also be taken into consideration, with respect to depth of the etch.

The materials used to make the various features of the transistor device shown can vary from one embodiment to the next, and the present disclosure is not intended to be limited to any particular material systems. For instance, some embodiments may be implemented with a silicon, germanium, silicon germanium (SiGe), or III-V material (e.g., gallium arsenide, indium arsenide, etc) substrate upon which a number of fins 101 are formed. Other embodiments may use semiconductor-on-insulator (SOI) or multilayer substrate structures to provide fins that have certain desired qualities (e.g., low sub-fin leakage). In a more general sense, any suitable substrate upon which non-planar devices such as FinFETs and nanowire transistors can be formed can be used in accordance with an embodiment.

The fins 101 may be native to the substrate or replacement fins provided by a recess and replace process that includes removing native sacrificial fin material and replacing it with a desired material of arbitrary composition. For instance, in one example case the substrate is a bulk silicon substrate and the fins 100 are native silicon fins, or silicon germanium (SiGe) replacement fins, or III-V material replacement fins, or a combination of native and replacement fins. Further recall the fin 100 may be etched or otherwise processed into one or more nanowires or ribbons in the channel area to provide a gate-all-around device, in some example embodiments. Note that reference to a nanowire or wire in this particular context is intended to include wires and ribbons or other derivations of a wire. Further note that a ribbon is typically a relatively thin wire.

The gate structure can be implemented with standard materials and forming techniques. For instance, the gate spacer 109a can be silicon oxide or silicon nitride or any other suitable spacer material. The gate dielectric 109c may be formed, for example, from materials such as silicon dioxide or high-k dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. The gate electrode 109b material may be a sacrificial material (e.g., polysilicon) that is later removed as part of an RMG process as previously explained, or a gate electrode material such as aluminum, tungsten, titanium, tantalum, nickel, platinum, highly doped silicon, a silicide of one of these (e.g., titanium silicide, nickel silicide, etc) or a combination of such material layers.

The source/drain regions 105 can also be native fin material or replacement material, depending on the desired device composition. In one example embodiment, the source/drain regions 105 are native silicon or other substrate material that is doped to provide the desired polarity (PMOS or NMOS). As will be appreciated in light of this disclosure, the doping can be carried out after the contact trench etch is performed, so that the dopant will not impede the etch process, according to some such embodiments. In another example embodiment, the source/drain regions 105 are an epitaxial deposition of SiGe into or on a native silicon fin pedestal for PMOS devices, and an epitaxial deposition of III-V material (e.g., indium arsenide) into or on a native silicon fin pedestal for NMOS devices. In some cases, the epi deposition occupies a space having an area defined by width $W_1$ and critical dimension $C_D$. Note that $C_D$ is effectively the width of the source/drain region 105 from one perspective (cross-section taken parallel to the fin) and $W_1$ is effectively the width of the source/drain region 105 from another perspective (cross-section taken perpendicular to the fin). The depth of the epitaxial deposition may be, for example, to the bottom of the fin, or past the bottom of the fin into the underlying substrate, or to some location above the bottom of the fin (so as to leave a fin pedestal upon which the epi sits). Any number of source/drain configurations can be used, and the present disclosure is not intended to be limited to any particularly kind.

The offset spacer 111 material can be any material that will either provide a degree of etch selectivity or otherwise etch slower than the semiconductor material of the source/drain region 105 being etched for a given etch chemistry. For instance, in one example embodiment, the offset spacers 111 are implemented with silicon nitride (SiN), which has a slower etch rate than silicon using standard etch chemistry. Note that the offset spacer 111 material may be the same as the gate spacer 109a material in some embodiments, but it need not be and may be a different material in other embodiments. Any number of oxides or nitrides or other suitable offset spacer material can be used to implement the offset spacers 111.

The contact metal 107 may be, for instance, the same metal as the gate electrode 109b, such as aluminum, tungsten, titanium, tantalum, nickel, platinum, highly doped silicon, a silicide of one of these (e.g., titanium silicide, nickel silicide, etc) or a combination of such material layers, but may also be different such as a germanide (e.g., titanium germanide, nickel germanide, etc) in the case of germanium-containing source/drain regions 105. Any number of contact metal materials can be used, and the present disclosure is not intended to be limited to any particular contact metal scheme. So long as the contact area interface between the source/drain regions 105 and the contact metal 107 can be enlarged as described herein.

Figures 2A, 2B:
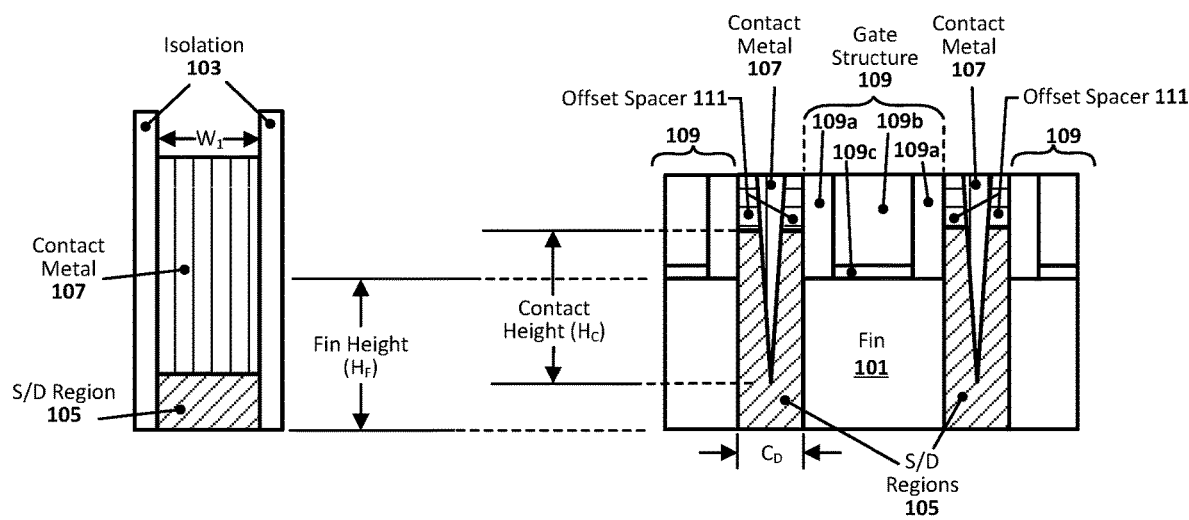
FIGS. 2a and 2b illustrate cross-sectional views of a non-planar semiconductor device having a contact architecture configured in accordance with another embodiment of the present disclosure.

In the example embodiment shown in FIGS. 1a-b, the contact metal 107 is relatively rectangular in shape, in both cross-sectional profiles shown. However, numerous trench shapes can result depending on the materials, mask patterns, and etch scheme employed, and any such shapes can be used to provide enhanced contact area as described herein. So, for instance, the rectangular trench shape shown in the cross-section view of FIG. 1b may result, for example, from a directional anisotropic etch, while the trench shape having the angled walls as shown in the cross-section view of FIG. 2b may result, for example, from an isotropic etch. Note that the cross-sectional views of the trenches shown in FIGS. 1a and 2a look the same, in these example embodiments. Further note that the offset spacer 111 is not visible in the cross-sectional views shown in FIGS. 1a and 2a in this particular embodiment, while other embodiments the offset spacer 111 may be visible in that cross-sectional view, as will be explained in turn. Other features of FIGS. 2a and 2b are similar to those shown in FIGS. 1a and 1b, and the previous relevant discussion equally applies to FIGS. 2a-b.

Figure 3A:
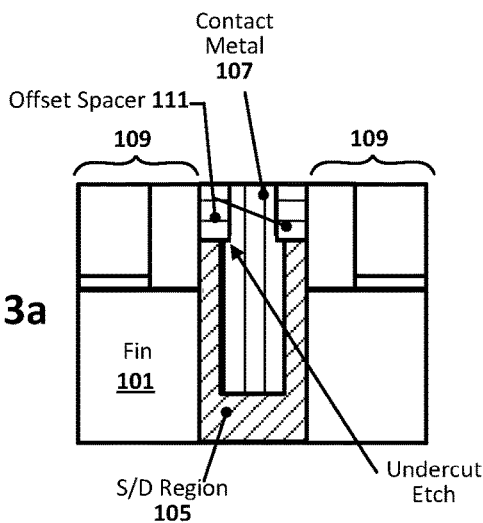
FIGS. 3a through 3d each illustrate a cross-sectional view of a non-planar semiconductor device having a contact architecture configured in accordance with another embodiment of the present disclosure.
Figure 3B:
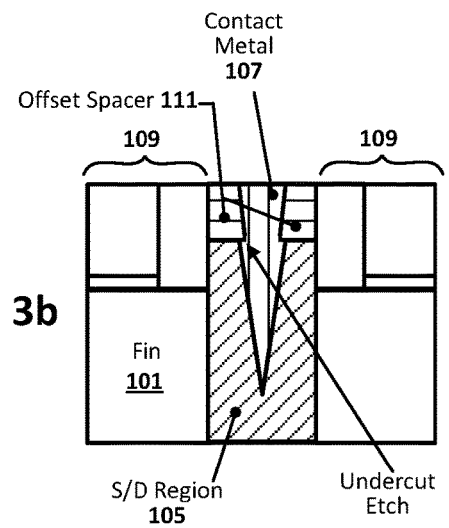
Figure 3C:
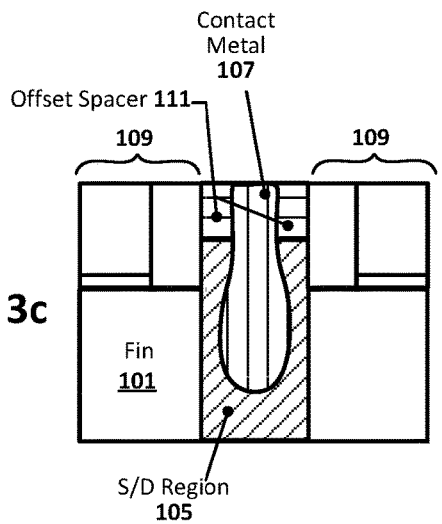
Figure 3D:
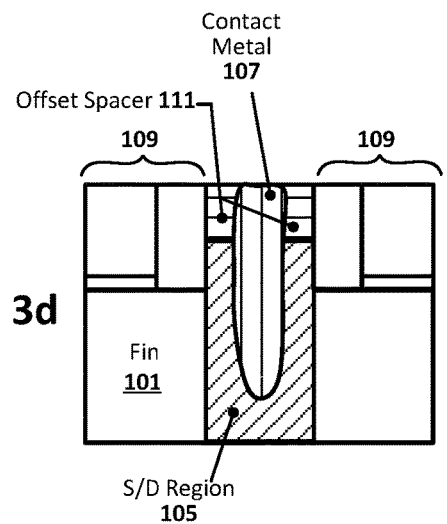

FIGS. 3a through 3d each illustrate a cross-sectional view of a non-planar semiconductor device having a contact architecture configured in accordance with another embodiment of the present disclosure. As can be seen in FIG. 3a, the contact trench etch employed provided a similar trench shape as shown in FIG. 1b except that an undercut etch was further employed such that the etch area in the source/drain region 105 expanded beyond the opening in the offset spacer 111. Such an undercut etch may be desirable, for instance, to further expand the contact area at the bottom of the contact trench. An undercut etch pattern may be achieved, for example, by an initial directional etch to pass through the offset spacer followed by an isotropic etch. Alternatively, the undercut etch pattern may be a function of the materials and etch chemistry selected, such as the case where the given etch chemistry used etches the spacer offset material much less aggressively than it etches the source/drain material. For example, potassium hydroxide (KOH) can be used to etch silicon-containing source/drain regions 105 relatively aggressively through a SiN offset spacer 111, so as to provide an undercut pattern as shown. FIG. 3b shows a similar pattern made with a less directional, more isotropic etch. FIGS. 3c and 3d each shows another example etch pattern that might result. Numerous other possible etch patterns with and without undercut features will be apparent and the present disclosure is not intended to be limited to any particular ones.

Figure 4A:
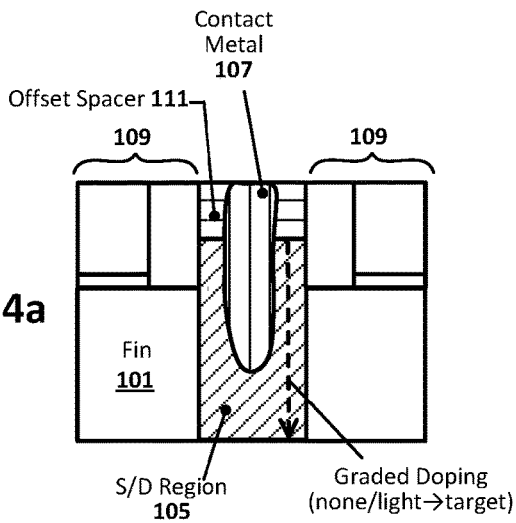
FIGS. 4a and 4b each illustrate a cross-sectional view of a non-planar semiconductor device having a contact architecture and selectively doped source/drain regions, in accordance with an embodiment of the present disclosure.
Figure 4B:
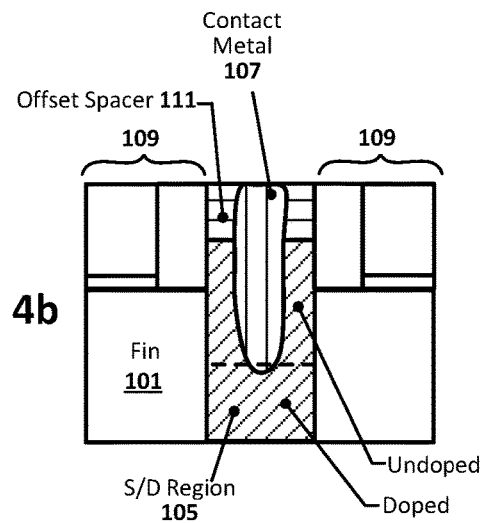

FIGS. 4a and 4b each illustrate a cross-sectional view of a non-planar semiconductor device having a contact architecture and selectively doped source/drain regions, in accordance with an embodiment of the present disclosure. As previously explained, doped semiconductor material may be more difficult to etch than undoped semiconductor material, in general. As such, using a doping scheme as provided herein can allow the contact trench etch process to be carried out in a more efficient manner. For instance, and with reference to FIG. 4a, the source/drain region 105 is provided with a graded dopant concentration that ranges from no doping or otherwise light doping at the top of the source/drain region 105 to a target doping level toward the bottom of the source/drain region 105. In the example of FIG. 4b, the source/drain region 105 is configured with a top undoped portion and a lower doped portion. The doping targets can be set based on the intended application and performance goals. The contact trench can pass through the undoped or otherwise lighter-doped portion of semiconductor material and stop at or around the location where the target dopant level begins. In still another embodiment (such as shown in FIG. 5f), the source/drain regions 105 can be doped after the trench etch process is carried out but before the contact metal is deposited. Numerous doping schemes will be apparent in light of this disclosure.

Figure 5A:
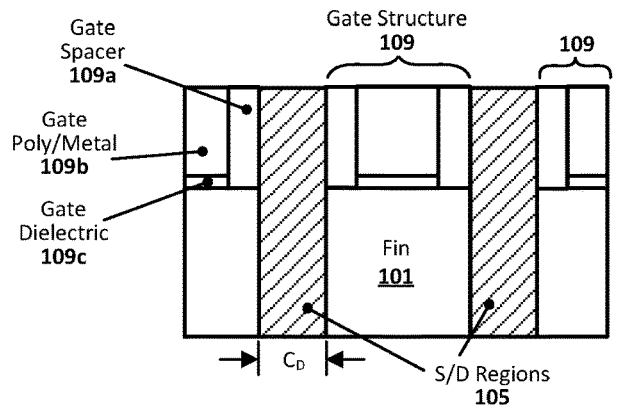
FIGS. 5a through 5g collectively illustrate a method for making a semiconductor contact architecture, in accordance with an embodiment of the present disclosure.
Figure 5B:
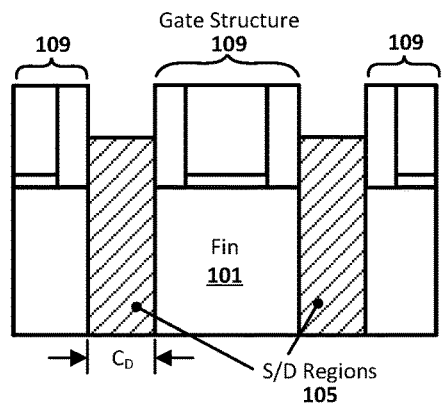
Figure 5C:
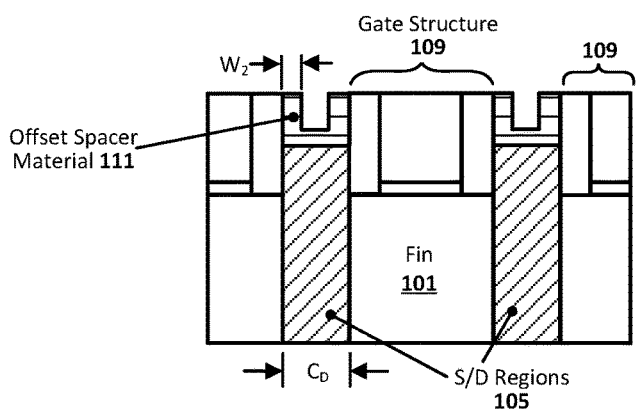
Figure 5D:
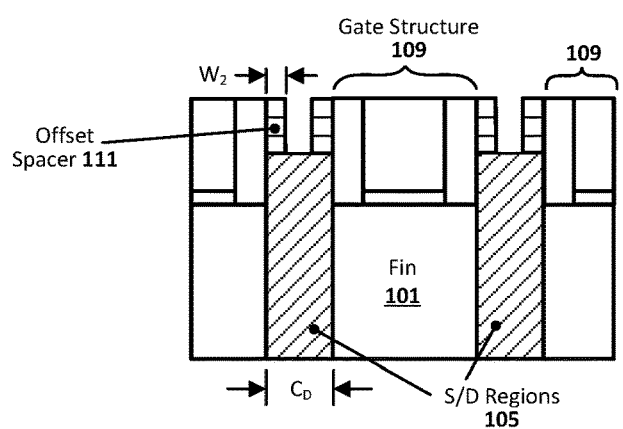
Figure 5E:
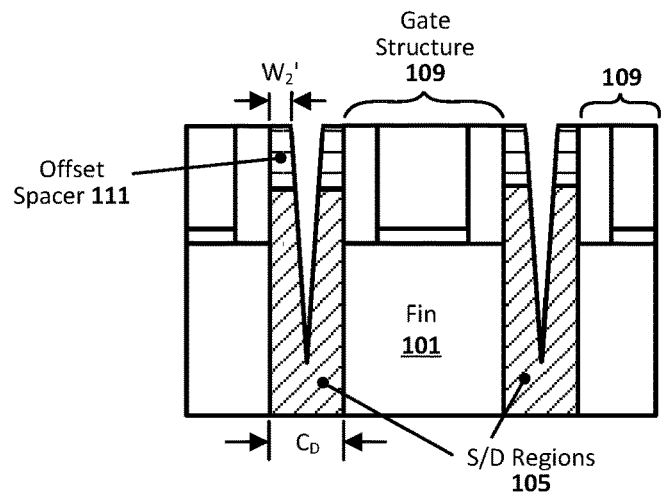
Figure 5F:
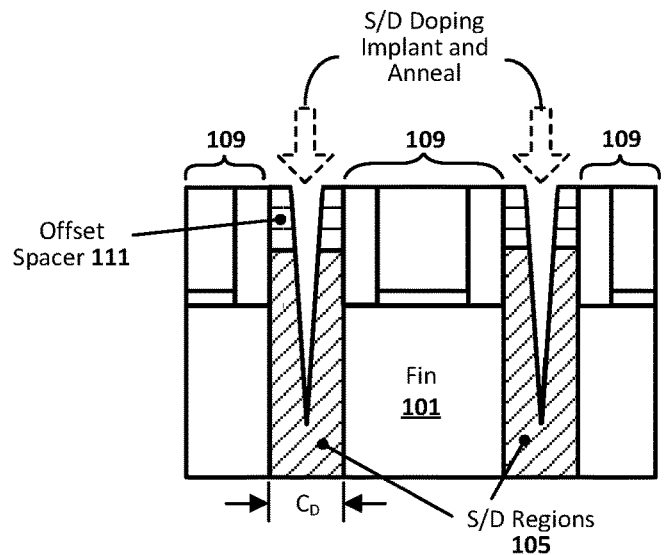

FIGS. 5a through 5g collectively illustrate a method for making a semiconductor contact architecture, in accordance with an embodiment of the present disclosure. Note that each of the FIGS. 5a-g shows a cross-sectional view taken parallel to the fin and cut through the fin and gate region. As can be seen in FIG. 5a, the example structure is shown at the point in the process where the semiconductor material making up the source/drain regions 105 is in place, whether it be semiconductor material that is native fin material or replacement semiconductor material. The semiconductor material in the source/drain regions 105 can be doped, undoped, or such that a portion is undoped or otherwise more lightly doped. In general, the S/D 105 semiconductor material in contact with the contact metal 107 will eventually be doped. For instance, undoped semiconductor may be initially used to facilitate the contact trench etch in some embodiments, wherein the undoped S/D 105 semiconductor material can be subsequently doped post trench formation, as will be discussed in turn with FIG. 5f. As previously explained, any number of material systems and forming processes can be used to implement the structure. In one example embodiment, the semiconductor material in the source/drain regions 105 is provisioned using a recess etch and replacement process, wherein native sacrificial silicon fins act as placeholders that are removed and replaced with an epitaxial deposition of, for instance, germanium, SiGe, or III-V material. In some embodiments, multiple fin compositions may be provided on the substrate, such as SiGe fins for PMOS devices and/or native silicon fins for NMOS devices and/or III-V material fins for NMOS devices.

FIG. 5b shows the resulting structure after the source/drain regions 105 have been recessed, according to an embodiment. The recess can be carried using any suitable dry and/or wet etch, depending on the material systems in place and as will be appreciated. The etch may be selective to materials other than the semiconductor material making up the source/drain regions 105 (i.e., etches the source/drain regions 105 but not the gate structure 109 materials and any other exposed non-target materials). Alternatively, the gate structures 109 and any other non-target surfaces can be masked-off during recess of the source/drain regions 105. In one example case, the etch is carried out using an anisotropic (or isotropic) KOH etch to recess silicon source/drain regions 105, with the gate spacer 109a being silicon nitride and the gate electrode 109b being polysilicon or other metal selective to KOH. Numerous other etch and material schemes can be used. Note that in this example embodiment, the source/drain regions 105 take up the entire distance $C_D$ and may have a width $W_1$ set as desired and suitable for the given device targets. Other embodiments may have different S/D region 105 dimensions.

Once the source/drain regions 105 are recessed, the process continues with depositing an offset spacer material 111, as shown in FIG. 5c, according to an embodiment. This deposition may be carried out using any number of suitable offset spacer materials and deposition processes. In one example case, for instance, SiN is deposited into the recesses using a low pressure chemical vapor deposition (LPCVD) or plasma-enhanced chemical vapor deposition (PECVD) process. Numerous other deposition and material schemes can be used. Note that the deposited offset spacer layer 111 is shown as being conformal in nature, but such is not required. As can further be seen in this example case, the offset spacer 111 has a thickness of $W_2$. In one specific example case, the gate spacer 109a SiN and the offset spacer is also SiN that selectively deposited into the recesses but only on the gate spacer 109a material using a LPCVD or PECVD process. In such an embodiment, the spacer material 111 etch shown in FIG. 5d may not be needed.

FIG. 5d shows the resulting structure after the conformally or otherwise deposited offset spacer material 111 is etched to provide collar-like offset spacer 111, according to an embodiment. The collar may cover all the surfaces of the trench opening to provide a continuous ring of material in some embodiments, but in other embodiments, the offset spacer 111 is only on certain surfaces of the trench opening, such as the gate spacer 109 portions of the trench as previously explained with reference to FIG. 5c. Further details of example offset spacer 111 configurations will be discussed in turn, with reference to FIGS. 6a through 8d. This etch can be carried using any suitable dry and/or wet etch, depending on the material systems in place and as will be appreciated. The etch may be selective to materials other than offset spacer material 111 (i.e., etches the offset spacer material 111 but not the gate structure 109 materials or other exposed non-target materials). Alternatively, the gate structures 109 can be masked-off during recess of the offset spacer material 111. In one example case, the etch is carried out via a dry anisotropic plasma etch using $CHF_3$ with $N_2$, with the gate spacer 109a being silicon dioxide and the gate electrode 109b being polysilicon or other metal selective to $CHF_3$. Numerous other suitable etch and material schemes can be used.

Once the offset spacer 111 is in place, the method may continue with etching the contact trench into the semiconductor material of the source/drain regions 105. FIG. 5e shows the resulting structure after the contact trench has been etched, according to an embodiment. The etch can be carried using any suitable dry and/or wet etch, depending on the material systems in place and as will be appreciated. The depth of the etch can vary from embodiment to embodiment. For instance, in some embodiments, the depth of the trench is at least 25% of the total vertical length of the corresponding source/drain region, or 30% of the total vertical length, or 35% of the total vertical length, or 40% of the total vertical length, or 45% of the total vertical length, or 50% of the total vertical length, or 55% of the total vertical length, or 60% of the total vertical length, or 65% of the total vertical length, or 70% of the total vertical length, or 75% of the total vertical length, or 80% of the total vertical length, or 85% of the total vertical length, or 90% of the total vertical length, or 95% of the total vertical length, or 100% of the total vertical length. Note that the etch used to form the contact trenches may be similar to the etch used to recess the source drain regions, and the previously relevant discussion with respect to FIG. 5b is equally applicable here. In one example case, the etch is carried out using an anisotropic KOH etch to recess silicon source/drain regions 105, with the gate spacer 109a and the offset spacer 111 being silicon nitride, and the gate electrode 109b being polysilicon or other metal selective to KOH. In another example case, the etch is carried out using an anisotropic sulfur hexafluoride ($SF_6$) or nitrogen trifluoride ($NF_3$), with the gate spacer 109a and the offset spacer 111 being silicon nitride and the gate electrode 109b being polysilicon or other metal selective to $SF_6$ or $NF_3$. Numerous other suitable etch and material schemes can be used, as will be appreciated. As can further be seen in this example case, note that the offset spacer 111 thickness of $W_2$ may be modified as a result of the etch, generally indicated in FIG. 5e as $W_2'$. In a more general sense, the overall shape of the offset spacer may be modified as a result of the etch, and in some example embodiments, the offset spacer 111 is substantially removed or otherwise diminished as a result of the etch. However, other embodiments may not modify thickness $W_2$.

FIG. 5f shows the structure undergoing a process where dopant is implanted into the etched source/drain regions 105 and an anneal is then executed to boost contact doping at the semiconductor-metal interface, according to an embodiment. Doping materials can be selected based on desired polarity, as typically done. In one example embodiment, the etched source/drain regions 105 are doped after trench formation with an ion or plasma implant process, and activated using a low temperature anneal and/or SPER (solid phase epitaxial regrowth). Any number of known implantation and annealing techniques can be used. In still other embodiments, recall that the semiconductor layer of the source/drain regions 105 may be configured with doped and undoped portions, or with a graded dopant concentration, as previously explained.

Figure 5G:
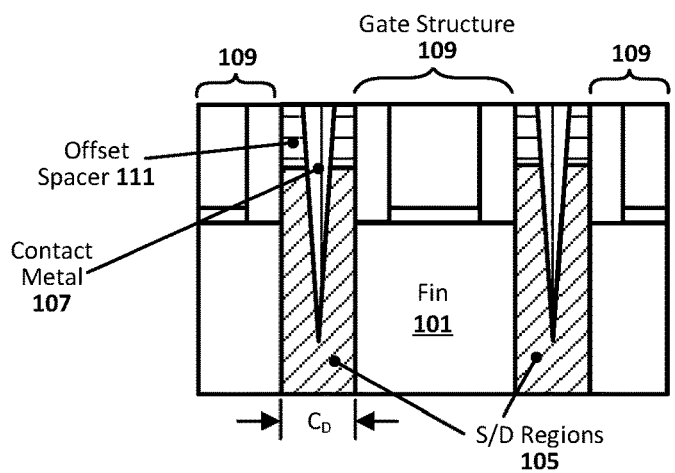

FIG. 5g shows the resulting structure after the contact metal is deposited and polished, according to an embodiment. This deposition may be carried out using any number of suitable metal contact materials and deposition processes. The contact metal may be deposited via, for example, sputter deposition or CVD. Post-deposition annealing can be used to induce reaction (e.g., silicide or germanide formation) between the metal and the underlying semiconductor material in the source/drain region 105. The previously noted example materials can be used, or a combination of contact layers. Numerous configurations can be used. Note that the contact metal fills the entire contact trench, although the fill may not be perfect (where trench is 100% filled) for whatever reason such as due to an unintentional pore or other defect. To this end, reference herein to a "substantial" filled contact trench is intended to include perfect fills as well as imperfect fills that have some degree of the trench (e.g., 10% or less, or 5% or less, or 2% or less, or 1% or less) that is not filled with contact material.

FIGS. 6a and 6b illustrate cross-sectional views of a non-planar semiconductor device having a contact architecture configured in accordance with another embodiment of the present disclosure. This embodiment is similar to the embodiment shown in FIGS. 2a-b, except for the offset spacer 111 configuration and the channel configuration as will be explained in turn. The previous relevant discussion is equally applicable here for the features that remain common to both embodiments. With respect to the differences, note that the offset spacer 111 of this example embodiment forms a continuous ring at the trench opening, as can be seen in the cross-section view of FIG. 6a. In contrast, the embodiment shown in FIGS. 2a-b only includes offset spacer 111 material on the gate spacer 109a portions of the contact trench, or otherwise not on the isolation 103 portions of the trench. In addition, this example embodiment includes a channel region that is configured with wires or ribbons 102 as shown in FIG. 6b, rather than a fin 101 as shown in FIG. 2b. While two wires are shown in this particular cross-section view of FIG. 6b, other embodiments may include fewer wires (one) or more wires (e.g., three, four, or more). As previously explained, the wires may be native substrate material or replacement material (e.g., SiGe nanowires above a silicon substrate).

FIG. 6c shows a perspective view of the example embodiment shown in FIGS. 6a and 6b. In this example case each of the contact metal 107 and offset spacer 111 has a spherical shape at the contact trench opening (although any geometric shape may result such as square or rectangular, depending on the mask pattern and etch scheme). As can be further seen, each offset spacer 111 abuts the corresponding gate spacer 109a, and the top nanowire/ribbon 102 of the corresponding channel contacts the source/drain region 105 just below the offset spacer 111. Further note in this example embodiment that some of the source/drains 105 are implemented with semiconductor material native to the substrate (fin 101a), while others of the source/drains 105 are implemented with semiconductor material not native to the substrate (fin 101b). Further note in this example configuration that non-native fin 101b is sitting in a trench of the substrate 100. Other embodiments may have the source/drain region 105 replacement material sitting flush on the substrate 100 surface (rather than in a recess), or on a pedestal fin that is native to the substrate 100. As can be further seen, the channel under the gate may have any number of configurations, including a fin, wire, or ribbon structure. In some embodiments having multiple transistor devices, a combination diverse channel configurations can be used, such as shown in FIG. 6c. For wire and ribbon channel configurations, note that multiple wires and/or ribbons may be provided. As previously explained, note that the channel material may be native to the substrate 100 or replacement material, just as with the source/drain regions 105. Numerous channel configurations and material system schemes will be apparent in light of this disclosure.

FIG. 6d illustrates various top down views of example shapes that the offset spacers 111 and contact metals 107 shown in FIGS. 6a through 6c may have, according to some such embodiments. In each case, note the continuous ring-like structure of the offset spacer 111. Further note that any number of geometric shapes for offset spacers 111 and contacts 107 can be patterned and the present disclosure is not intended to be limited to any particular shape configuration.

FIGS. 7a and 7b illustrate cross-sectional views of a non-planar semiconductor device having a contact architecture configured in accordance with another embodiment of the present disclosure. This embodiment is similar to the embodiment shown in FIGS. 2a-b, except for the channel configuration. The previous relevant discussion is equally applicable here for the features that remain common to both embodiments. Note that the offset spacer 111 of this example embodiment is not a continuous ring at the trench opening, but rather is only on the gate spacer 109 portions of the trench opening, as can be seen in the cross-section view of FIGS. 7a and 7b. With respect to the channel configuration, this example embodiment includes a channel region that is configured with wires or ribbons 102 as shown in FIG. 7b, and is similar to the channel configuration shown in FIG. 6b. The previous relevant discussion with respect to the nanowire/ribbon 102 channel configuration is equally applicable here.

FIG. 7c shows a perspective view of the example embodiment shown in FIGS. 7a and 7b. In this example case each of the contact metal 107 and offset spacer 111 has a rectangular shape at the contact trench opening (although any geometric shape may result as previously explained). As can be further seen, each offset spacer 111 abuts the corresponding gate spacer 109a, and the top nanowire/ribbon 102 of the corresponding channel contacts the source/drain region 105 just below the offset spacer 111. The previous relevant discussion with respect to the native and replacement source/drain regions 105 is equally applicable here.

FIG. 7d illustrates various top down views of example shapes that the offset spacers 111 and contact metals 107 shown in FIGS. 7a through 7c may have, according to some such embodiments. In each case, note the non-continuous nature of the offset spacer 111. In these example embodiments, the offset spacer 111 is substantially on the gate spacer 109a and substantially not on the isolation 103, such that contact metal 107 can be directly against the isolation 103. Note, however, that in some such example embodiments, a liner or diffusion barrier may be provided between the contact metal 107 and the isolation 103. Further note that any number of geometric shapes for offset spacers 111 and contacts 107 can be patterned and the present disclosure is not intended to be limited to any particular shape configuration.

FIGS. 8a and 8b illustrate cross-sectional views of a non-planar semiconductor device having a contact architecture configured in accordance with another embodiment of the present disclosure. This embodiment is similar to the embodiment shown in FIGS. 2a-b, except for the channel configuration and the fact that the offset spacer 111 has been removed or otherwise substantially diminished. The previous relevant discussion is equally applicable here for the features that remain common to both embodiments. Note that the offset spacer 111 of this example embodiment can be completely removed, but need not be, and in some such embodiments, is a thinner version of the originally provisioned offset spacer 111. Note that having less offset spacer 111 allows for a great area of semiconductor-metal interface, which may further lower contact resistance. As previously explained, the offset spacer 111 can be removed during the contact trench etch and/or a dedicated etch that target removal of the offset spacer 111. With respect to the channel configuration, this example embodiment includes a channel region that is configured with wires or ribbons 102 as shown in FIG. 7b, and is similar to the channel configuration shown in FIG. 6b. The previous relevant discussion with respect to the nanowire/ribbon 102 channel configuration is equally applicable here.

FIG. 8c shows a perspective view of the example embodiment shown in FIGS. 7a and 7b. In this example case each of the contact metal 107 has a square shape at the contact trench opening (although any geometric shape may result as previously explained) and not offset spacer 111 remains in some such configurations. As can be further seen, each upper square-shaped portion of the metal contact 107 fills the entire trench opening and continues into the semiconductor material of the source/drain region 105 to provide greater contact surface area, and the top nanowire/ribbon 102 of the corresponding channel contacts the source/drain region 105 just below that upper square-shaped portion. The previous relevant discussion with respect to the native and replacement source/drain regions 105 is equally applicable here.

FIG. 8d illustrates various top down views of example shapes that the contact metals 107 shown in FIGS. 8a through 8c may have, according to some such embodiments. In these example embodiments, the offset spacer 111 has been removed or is otherwise substantially diminished, such that contact metal 107 can be directly against the isolation 103 and gate spacer 109a. Note, however, that in some such example embodiments, a liner or barrier layer may be provided between the contact metal 107 and the isolation 103 and gate spacer 109a. Further note that any number of geometric shapes for contacts 107 can be patterned and the present disclosure is not intended to be limited to any particular shape configuration.

Example System

Figure 9:
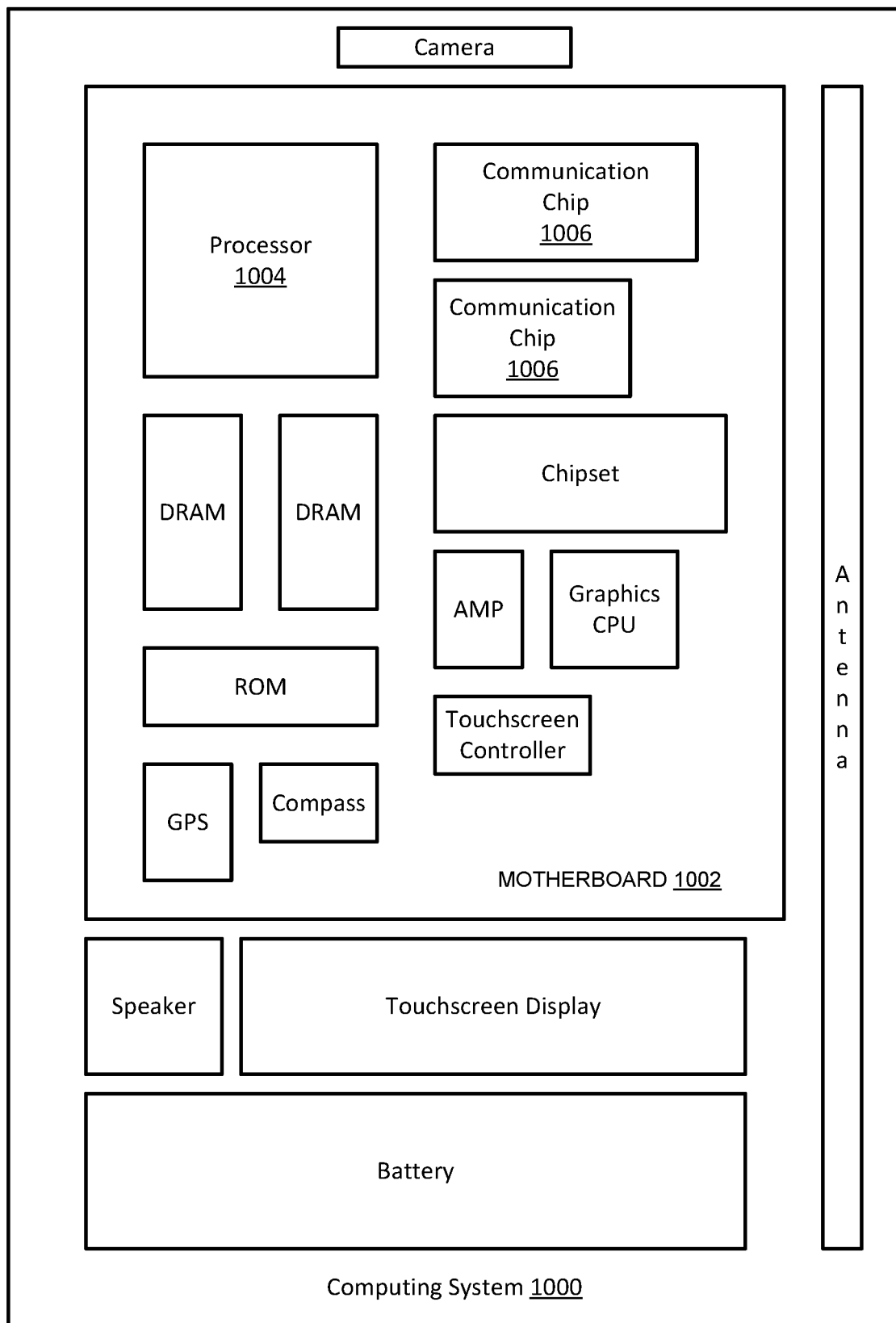
FIG. 9 illustrates a computing system implemented with one or more integrated circuit structures configured in accordance with an embodiment of the present disclosure.

FIG. 9 illustrates a computing system implemented with one or more integrated circuit structures configured in accordance with an embodiment of the present disclosure. As can be seen, the computing system 1000 houses a motherboard 1002. The motherboard 1002 may include a number of components, including but not limited to a processor 1004 and at least one communication chip 1006 (two are shown in this example), each of which can be physically and electrically coupled to the motherboard 1002, or otherwise integrated therein. As will be appreciated, the motherboard 1002 may be, for example, any printed circuit board, whether a main board or a daughterboard mounted on a main board or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures configured with contact structures as provided herein. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others. The processor 1004 of the computing system 1000 includes an integrated circuit die packaged within the processor 1004. In some such example embodiments of the present disclosure, the integrated circuit die of the processor 1004 may include one or more fin-based transistors including contact structures as provided herein. The term "processor" may refer to any device or portion of a device that processes, for instance, electronic data from registers and/or memory to transform that electronic data into other electronic data that may be stored in registers and/or memory.

The communication chip 1006 may also include an integrated circuit die packaged within the communication chip 1006. In accordance with some such example embodiments, the integrated circuit die of the communication chip 1006 includes one or more fin-based transistors (e.g., tri-gate transistors, nanowire transistors, nanoribbon transistors) having contact structures as provided herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the system 1000 may be any other electronic device that processes data or employs transistor devices and other electronic devices (e.g., diodes) configured with contact structures as described herein. As will be appreciated in light of this disclosure, various embodiments of the present disclosure can be used to improve performance on products fabricated at any process node (e.g., in the micron range, or sub-micron and beyond) by allowing for the use of fin-based transistors having high mobility customized and diverse channel configurations (e.g., Si, SiGe, Si/SiGe, III-V, and/or combinations thereof) on the same die.

Further Example Embodiments

The following examples pertain to further embodiments, from which numerous permutations and configurations will be apparent.

Example 1 is a semiconductor device, comprising: a substrate configured with a fin extending from the substrate, the fin including a channel region; a gate electrode over the channel region, wherein a gate dielectric layer is provided between the gate electrode and the channel region and a gate spacer is provided on sides of the gate electrode; source and drain regions in or on the fin and adjacent the channel region and comprising semiconductor material; a trench extending into each of the source and drain regions; and contact metal within the trench in each of the source and drain regions.

Example 2 includes the subject matter of Example 1, wherein each trench has a bottom and a top, and the device further comprises an offset spacer at the top of each trench.

Example 3 includes the subject matter of Example 2, wherein each of the trenches continues through the corresponding offset spacer, and the contact metal substantially fills each of the trenches.

Example 4 includes the subject matter of Example 2 or 3, wherein each offset spacer is on top of the semiconductor material of the source and drain regions.

Example 5 includes the subject matter of any of Examples 2 through 4, wherein each offset spacer is in contact with the gate spacer provided on sides of the gate electrode.

Example 6 includes the subject matter of any of Examples 2 through 5, wherein the offset spacers and the gate spacer provided on sides of the gate electrode comprise the same material.

Example 7 includes the subject matter of any of Examples 1 through 6, wherein the fin comprises a semiconductor material that is not native to the substrate.

Example 8 includes the subject matter of any of Examples 1 through 7, wherein the semiconductor material of the source and drain regions is not native to the substrate.

Example 9 includes the subject matter of any of Examples 1 through 8, wherein the fin comprises one or more wires or ribbons in the channel region.

Example 10 includes the subject matter of any of Examples 1 through 9, wherein the source and drain regions are raised such that they extend beyond the top of the fin.

Example 11 includes the subject matter of any of Examples 1 through 10, wherein the source and drain regions each is configured with a graded doping scheme that includes lower doping in areas through which the corresponding trench passes and higher doping in other areas.

Example 12 includes the subject matter of any of Examples 1 through 10, wherein the source and drain regions each include a doped portion and an undoped portion.

Example 13 includes the subject matter of Example 12, wherein each of the trenches passes through the corresponding undoped portion and ends proximate to or in the doped portion.

Example 14 includes the subject matter of any of Examples 1 through 13, and further includes multiple gate structures each over a corresponding channel region of the fin, each gate structure including a corresponding gate electrode, gate dielectric, and gate spacer, wherein the distance between neighboring gate structures substantially defines the width of the corresponding source or drain region, the width being in a direction that is parallel with the fin.

Example 15 includes the subject matter of any of Examples 1 through 14, wherein the device is part of a computing device.

Example 16 includes the subject matter of Example 15, wherein the computing device is a mobile computing device. The mobile computing device may be, for instance, a tablet, smartphone, laptop, or other mobile computing device having a battery or other renewable power source.

Example 17 is an integrated circuit device, comprising: a substrate configured with a fin extending from the substrate, the fin including a plurality of channel regions; a plurality of gate structures, each gate structure over a corresponding one of the channel regions and including a gate electrode, a gate dielectric, and a gate spacer; a plurality of pairs of source and drain regions, each pair adjacent a corresponding one of the channel regions and comprising semiconductor material; a trench extending into each of the source and drain regions, each trench having a bottom and a top, and further having a depth that is at least 25% of the total vertical length of the corresponding source/drain region; and contact metal substantially filling the trench in each of the source and drain regions.

Example 18 includes the subject matter of Example 17, and further includes an offset spacer at the top of each trench, wherein each of the trenches continues through the corresponding offset spacer, wherein each offset spacer is between gate spacers of neighboring gate structures, and the offset spacer is in contact with both of those gate spacers.

Example 19 includes the subject matter of Example 18, wherein the offset spacers and the gate spacers comprise the same material.

Example 20 includes the subject matter of any of Examples 17 through 19, wherein the fin comprises a semiconductor material that is not native to the substrate.

Example 21 includes the subject matter of any of Examples 17 through 20, wherein the semiconductor material of the source and drain regions is not native to the substrate.

Example 22 includes the subject matter of any of Examples 17 through 21, wherein the fin comprises one or more wires or ribbons in the channel region.

Example 23 includes the subject matter of any of Examples 17 through 22, wherein the source and drain regions are raised such that they extend beyond the top of the fin.

Example 24 includes the subject matter of any of Examples 17 through 23, wherein the source and drain regions each is configured with a graded doping scheme that includes lower doping in areas through which the corresponding trench passes and higher doping in other areas.

Example 25 includes the subject matter of any of Examples 17 through 23, wherein the source and drain regions each include a doped portion and an undoped portion.

Example 26 includes the subject matter of Example 25, wherein each of the trenches passes through the corresponding undoped portion and ends proximate to or in the doped portion.

Example 27 includes the subject matter of any of Examples 17 through 26, wherein the distance between neighboring gate structures substantially defines the width of the corresponding source or drain region, the width being in a direction that is parallel with the fin.

Example 28 includes the subject matter of any of Examples 17 through 27, wherein the device is part of a computing device.

Example 29 includes the subject matter of Example 28, wherein the computing device is a mobile computing device.

Example 30 is a method for forming semiconductor contacts, the method comprising: providing a substrate configured with a fin extending from the substrate, the fin including a channel region; providing a gate electrode over the channel region, wherein a gate dielectric layer is provided between the gate electrode and the channel region and a gate spacer is provided on sides of the gate electrode; providing source and drain regions in the fin and adjacent the channel region and comprising semiconductor material; etching a trench into each of the source and drain regions; and substantially filling the trench in each of the source and drain regions with contact metal.

Example 31 includes the subject matter of Example 30, wherein each trench has a bottom and a top, and the method further comprises forming an offset spacer at the top of each trench.

Example 32 includes the subject matter of Example 31, wherein each of the trenches continues through the corresponding offset spacer, and the contact metal also substantially fills the offset spacer portion of the trench.

Example 33 includes the subject matter of Example 31 or 32, wherein each offset spacer is on top of the semiconductor material of the source and drain regions.

Example 34 includes the subject matter of any of Examples 31 through 33, wherein each offset spacer is in contact with the gate spacer provided on sides of the gate electrode.

Example 35 includes the subject matter of any of Examples 31 through 34, wherein the offset spacers and the gate spacer provided on sides of the gate electrode comprise the same material.

Example 36 includes the subject matter of any of Examples 30 through 35, wherein the fin comprises a semiconductor material that is not native to the substrate.

Example 37 includes the subject matter of any of Examples 30 through 36, wherein the semiconductor material of the source and drain regions is not native to the substrate.

Example 38 includes the subject matter of any of Examples 30 through 37, wherein the fin comprises one or more wires or ribbons in the channel region.

Example 39 includes the subject matter of any of Examples 30 through 38, wherein the source and drain regions are raised such that they extend beyond the top of the fin.

Example 40 includes the subject matter of any of Examples 30 through 39, wherein the source and drain regions each is configured with a graded doping scheme that includes lower doping in areas through which the corresponding trench passes and higher doping in other areas.

Example 41 includes the subject matter of any of Examples 30 through 39, wherein the source and drain regions each include a doped portion and an undoped portion.

Example 42 includes the subject matter of Example 41, wherein each of the trenches passes through the corresponding undoped portion and ends proximate to or in the doped portion.

Example 43 includes the subject matter of any of Examples 30 through 42, wherein after etching the trench into each of the source and drain regions but prior to substantially filling the trench, the method further comprises doping the semiconductor material of the source and drain regions.

Example 44 includes the subject matter of Example 43, wherein doping the semiconductor material of the source and drain regions comprises an implant doping and annealing scheme.

Example 45 includes the subject matter of any of Examples 30 through 44, wherein etching the trench into each of the source and drain regions comprises etching the trenches such that the depth of each trench is at least 25% of the total vertical length of the corresponding source/drain region.

Example 46 includes the subject matter of any of Examples 30 through 45, wherein etching the trench into each of the source and drain regions comprises etching the trenches such that the depth of each trench is at least 50% of the total vertical length of the corresponding source/drain region.

Example 47 includes the subject matter of any of Examples 30 through 46, wherein etching the trench into each of the source and drain regions comprises etching the trenches such that the depth of each trench is at least 60% of the total vertical length of the corresponding source/drain region.

Example 48 includes the subject matter of any of Examples 30 through 47, wherein etching the trench into each of the source and drain regions comprises etching the trenches such that the depth of each trench is at least 70% of the total vertical length of the corresponding source/drain region.

Example 49 includes the subject matter of any of Examples 30 through 48, wherein etching the trench into each of the source and drain regions comprises etching the trenches such that the depth of each trench is at least 80% of the total vertical length of the corresponding source/drain region.

Example 50 includes the subject matter of any of Examples 30 through 49, wherein etching the trench into each of the source and drain regions comprises etching the trenches such that the depth of each trench is at least 90% of the total vertical length of the corresponding source/drain region.

The foregoing description of example embodiments of the present disclosure has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto.

What is claimed is:

1. A semiconductor device, comprising:
    a body including semiconductor material;
    a gate structure at least over the body, the gate structure including a gate electrode and a gate dielectric, wherein the gate dielectric is between the gate electrode and the body, wherein the gate structure has an upper surface;
    a source region and a drain region, the body between the source and drain regions, wherein the source and drain regions include semiconductor material;
    a first spacer above the source region, and a second spacer above the drain region;
    a third spacer above the source region and spaced apart from the first spacer, and a fourth spacer above the drain region and spaced apart from the second spacer, wherein the first spacer and the third spacer have co-planar upper surfaces, and the second spacer and the fourth spacer have co-planar upper surfaces, and wherein the upper surfaces of the first spacer, the second spacer, the third spacer and the fourth spacer are co-planar with the upper surface of the gate structure, wherein each of the first, second, third and fourth spacers has a bottom surface above a bottom surface of the gate dielectric, wherein the bottom surface of each of the first and third spacers is on the source region, and wherein the bottom surface of each of the second and fourth spacers is on the drain region;

a first trench extending from a top of the first spacer and the third spacer and into the source region below the first spacer and the third spacer, and a second trench extending from a top of the second spacer and the fourth spacer and into the drain region below the second spacer and the fourth spacer, wherein the first spacer and the third spacer do not extend into the source region, and the second spacer and the fourth spacer do not extend into the drain region; and a first contact structure within the first trench and a second contact structure within the second trench, the first and second contact structures including metal, wherein the first contact structure has a top surface co-planar with the upper surface of the first spacer and with the upper surface of the third spacer, and wherein the second contact structure has a top surface co-planar with the upper surface of the second spacer and co-planar with the upper surface of the fourth spacer.

2. The device of claim 1, wherein a portion of the first contact structure is laterally adjacent and in contact with the first spacer, and a portion of the second contact structure is laterally adjacent and in contact with the second spacer.

3. The device of claim 1 wherein the first spacer is on top of the semiconductor material included in the source region, and the second spacer is on top of the semiconductor material included in the drain region.

4. The device of claim 1 wherein one of the first and second spacers is laterally adjacent and in contact with a gate spacer, the gate spacer adjacent the gate structure.

5. The device of claim 4 wherein the first and second spacers and the gate spacer comprise the same material.

6. The device of claim 1 wherein material of the first spacer has a slower etch rate than the semiconductor material of the source region, and material of the second spacer has a slower etch rate than the semiconductor material of the drain region.

7. The device of claim 1 wherein the body is a fin, and the fin is between portions of the gate structure.

8. The device of claim 1 wherein the body includes a nanowire, and the gate structure wraps around the nanowire.

9. The device of claim 1 wherein the source and drain regions are raised such that they extend beyond the top of the body.

10. The device of claim 1 wherein the source and drain regions include a graded doping scheme that includes lower doping in areas through which the corresponding first or second trench passes and higher doping in other areas.

11. The device of claim 1 wherein the source and drain regions each include a doped portion and an undoped portion.

12. The device of claim 11 wherein each of the first and second trenches passes through the corresponding undoped portion and ends proximate to or in the doped portion.

13. The device of claim 1 wherein the first contact structure further includes a first barrier or liner layer between walls of the first trench and the metal of the first contact structure, and the second contact structure further includes a second barrier or liner layer between walls of the second trench and the metal of the second contact structure.

14. The device of claim 1 wherein the device is part of a computing device.

15. The device of claim 14 wherein the computing device is a mobile computing device.

16. An integrated circuit including at least one transistor, the integrated circuit comprising:

a fin including semiconductor material;

a gate structure at least over the fin, the gate structure including a gate electrode and a gate dielectric, the gate dielectric between the gate electrode and the fin, wherein the gate structure has an upper surface;

a source region and a drain region, the fin between the source and drain regions, wherein the source and drain regions include semiconductor material;

a first spacer structure above the source region, and a second spacer structure above the drain region;

a third spacer structure above the source region and spaced apart from the first spacer structure, and a fourth spacer structure above the drain region and spaced apart from the second spacer structure, wherein the first spacer structure and the third spacer structure have co-planar upper surfaces, and the second spacer structure and the fourth spacer structure have co-planar upper surfaces, and wherein the upper surfaces of the first spacer structure, the second spacer structure, the third spacer structure and the fourth spacer structure are co-planar with the upper surface of the gate structure, wherein each of the first, second, third and fourth spacer structures has a bottom surface above a bottom surface of the gate dielectric, wherein the bottom surface of each of the first and third spacers is on the source region, and wherein the bottom surface of each of the second and fourth spacers is on the drain region;

a first trench extending from a top of the first spacer structure and the third spacer structure and into the source region below the first spacer structure and the third spacer structure, and a second trench extending from a top of the second spacer structure and the fourth spacer structure and into the drain region below the second spacer structure and the fourth spacer structure, the first trench having a depth that is at least 25% of the total vertical length of the source region, and the second trench having a depth that is at least 25% of the total vertical length of the drain region, wherein the first spacer structure and the third spacer structure do not extend into the source region, and/or the second spacer structure and the fourth spacer structure do not extend into the drain region; and a first contact structure substantially filling the first trench and a second contact structure substantially filling the second trench, the first and second contact structures including metal, wherein the first contact structure has a top surface co-planar with the upper surface of the first spacer structure and with the upper surface of the third spacer structure, and wherein the second contact structure has a top surface co-planar with the upper surface of the second spacer structure and co-planar with the upper surface of the fourth spacer structure.

17. The integrated circuit of claim 16, wherein the first contact structure further includes a first barrier or liner layer between walls of the first trench and the metal of the first contact structure, and/or the second contact structure further includes a second barrier or liner layer between walls of the second trench and the metal of the second contact structure.

18. An integrated circuit including at least one transistor, the integrated circuit comprising:

a body including semiconductor material;

a gate structure at least over the body, the gate structure including a gate electrode and a gate dielectric, wherein the gate dielectric is between the gate electrode and the body, wherein the gate structure has an upper surface;

a source region and a drain region, the body between the source and drain regions, wherein the source and drain regions include semiconductor material;

a first spacer structure above the source region, and a second spacer structure above the drain region;

a third spacer structure above the source region and spaced apart from the first spacer structure, and a fourth spacer structure above the drain region and spaced apart from the second spacer structure, wherein the first spacer structure and the third spacer structure have co-planar upper surfaces, and the second spacer structure and the fourth spacer structure have co-planar upper surfaces, and wherein the upper surfaces of the first spacer structure, the second spacer structure, the third spacer structure and the fourth spacer structure are co-planar with the upper surface of the gate structure;

a first trench extending from a top of the first spacer structure and the third spacer structure and into the source region below the first spacer structure and the third spacer structure, and a second trench extending from a top of the second spacer structure and the fourth spacer structure and into the drain region below the second spacer structure and the fourth spacer structure, wherein the first trench extends down at least 20 nanometers (nm) from a top surface of the source region, and the second trench extends down at least 20 nm from a top surface of the drain region, wherein the first spacer structure and the third spacer structure do not extend into the source region, and/or the second spacer structure and the fourth spacer structure do not extend into the drain region; and a first contact structure in the first trench and a second contact structure in the second trench, the first and second contact structures including metal, wherein the first contact structure has a top surface co-planar with the upper surface of the first spacer structure and with the upper surface of the third spacer structure, and wherein the second contact structure has a top surface co-planar with the upper surface of the second spacer structure and co-planar with the upper surface of the fourth spacer structure.

19. The integrated circuit of claim 18, wherein the first contact structure further includes a first barrier or liner layer between walls of the first trench and the metal of the first contact structure, and/or the second contact structure further includes a second barrier or liner layer between walls of the second trench and the metal of the second contact structure.

* * * * *